(12) United States Patent
Teraji et al.

(10) Patent No.: US 10,304,978 B2
(45) Date of Patent: May 28, 2019

(54) COMPOUND SOLAR CELL AND PRODUCTION METHOD THEREFOR

(71) Applicant: NITTO DENKO CORPORATION, Ibaraki-shi, Osaka (JP)

(72) Inventors: Seiki Teraji, Ibaraki (JP); Kazunori Kawamura, Ibaraki (JP); Hiroto Nishii, Ibaraki (JP); Taichi Watanabe, Ibaraki (JP); Yusuke Yamamoto, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/421,580

(22) PCT Filed: Jun. 18, 2013

(86) PCT No.: PCT/JP2013/066638
§ 371 (c)(1),
(2) Date: Feb. 13, 2015

(87) PCT Pub. No.: WO2014/030412
PCT Pub. Date: Feb. 27, 2014

(65) Prior Publication Data
US 2015/0303329 A1    Oct. 22, 2015

(30) Foreign Application Priority Data

Aug. 24, 2012  (JP) ................................. 2012-185197

(51) Int. Cl.
*H01L 31/032* (2006.01)
*H01L 31/18* (2006.01)
*H01L 31/0749* (2012.01)

(52) U.S. Cl.
CPC ...... *H01L 31/0322* (2013.01); *H01L 31/0749* (2013.01); *H01L 31/18* (2013.01); *Y02E 10/541* (2013.01); *Y02P 70/521* (2015.11)

(58) Field of Classification Search
CPC . H01L 31/0322; H01L 31/0749; H01L 31/18; H01L 31/0328; H01L 31/03923; Y02E 10/50; Y02E 10/542
See application file for complete search history.

(56) References Cited

U.S. PATENT DOCUMENTS

| | | | |
|---|---|---|---|
| 5,626,688 A | * | 5/1997 | Probst ................ H01L 31/0322 136/264 |
| 6,259,016 B1 | | 7/2001 | Negami et al. |

(Continued)

FOREIGN PATENT DOCUMENTS

| | | |
|---|---|---|
| CN | 1350335 A | 5/2002 |
| CN | 1820358 A | 8/2006 |

(Continued)

OTHER PUBLICATIONS

Torndahl et al., "Growth and characterization of ZnO-based buffer layers for CIGS solar cells", SPIE 2010.*

(Continued)

*Primary Examiner* — Matthew T Martin
(74) *Attorney, Agent, or Firm* — Westerman, Hattori, Daniels & Adrian, LLP

(57) ABSTRACT

A compound solar cell having a higher conversion efficiency and a method for producing the compound solar cell at lower costs are provided. The compound solar cell includes a CIGS light absorbing layer, a buffer layer and a front side electrode layer provided on a substrate. An interface layer made of a mixed crystal compound having a composition represented by the following general formula is provided (Continued)

between the CIGS light absorbing layer and the buffer layer: $Zn(O_x,S_{1-x})$ ... (1), wherein X is $0.9 < X \leq 1$.

8 Claims, 3 Drawing Sheets

(56) References Cited

U.S. PATENT DOCUMENTS

| | | | | |
|---|---|---|---|---|
| 6,534,704 | B2* | 3/2003 | Hashimoto | H01L 31/032 136/252 |
| 8,093,096 | B2 | 1/2012 | Kushiya | |
| 2002/0043278 | A1 | 4/2002 | Hashimoto et al. | |
| 2006/0180200 | A1* | 8/2006 | Platzer Bjorkman | H01L 31/0322 136/265 |
| 2009/0087940 | A1 | 4/2009 | Kushiya | |
| 2010/0051105 | A1* | 3/2010 | Pinarbasi | H01L 31/0296 136/262 |
| 2010/0233841 | A1 | 9/2010 | Platzer Bjorkman et al. | |
| 2011/0081744 | A1* | 4/2011 | Kawano | C23C 18/1204 438/95 |
| 2014/0053904 | A1 | 2/2014 | Nakagawa et al. | |

FOREIGN PATENT DOCUMENTS

| | | |
|---|---|---|
| CN | 101213674 A | 7/2008 |
| CN | 101764181 A | 6/2010 |
| CN | 102337516 A | 2/2012 |
| JP | 2000-323733 A | 11/2000 |
| JP | 2002-124688 A | 4/2002 |
| JP | 2002-343987 A | 11/2002 |
| JP | 2004-47916 A | 2/2004 |
| JP | 2005-228975 A | 8/2005 |
| JP | 2006-525671 A | 11/2006 |
| JP | 2010-251525 A | 11/2010 |
| JP | 2012-4287 A | 1/2012 |
| JP | 2012-235024 A | 11/2012 |
| WO | WO2011158899 A1 * | 12/2011 ......... H01L 31/1884 |

OTHER PUBLICATIONS

Naghavi et al., "Buffer layers and transparent conducting oxides for chalcopyrite Cu(In,Ga)(S,Se)2 based thin film photovoltaics: present status and current developments", Progress in Photovoltaics, 2010.*

Ramanathan et al., "A comparative study of Zn(O,S) Buffer Layers and CIGS Solar Cells Fabricated by CBD, ALD and Sputtering", NREL Conference Paper, Jun. 2012.*

Platzer-Bjorkman et al., "Zn(O,S) buffer layers by atomic layer deposition in Cu(In,Ga)Se2 based thin film solar cells: Band alignment and sulfur gradient", Journal of Applied Physics, 2006.*

International Search Report dated Jul. 23, 2013, issued in corresponding application No. PCT/JP2013/066638.

Hori et al., "Photo current metastability in Cu(In,Ga)Se2 solar cells with controlled conduction band alignment", Current Applied Physics, Mar. 2010, pp. S150-S153, vol. 10, Issue 2 Supplement.

Hariskos et al., "The Zn(S,O,OH)/ZnMgO Buffer in Thin-Film Cu(In,Ga)(Se,S)2-Based Solar Cells Part II: Magnetron Sputtering of the ZnMgO Buffer Layer for In-Line Co-Evaporated Cu(In,Ga)Se2 Solar Cells", Progress in Photovoltaics: Research and Applications, Apr. 28, 2009,pp. 479-488, vol. 17, cited in the ISR.

Notification of Transmittal of Translation of the International Preliminary Report on Patentability (Form PCT/IB/338) of International Application No. PCT/JP2013/066638 dated Mar. 5, 2015 with Forms PCT/IB/373 and PCT/ISA/237 (6 pages).

Platzer-Björkman C. et al., "The Zn(O,S) buffer layers by atomic layer deposition in Cu(In,Ga)Se2 based thin film solar cells: Band alignment and sulfur gradient", Journal of Applied Physics , American Institute of Physics, US vol. 100, No. 4, 2006, pp. 44506-1 to 44506-9.

Supplementary European Search Report dated Mar. 22, 2016, issued in counterpart European Patent Application No. 13830458.9 (7 pages).

Office Action dated Jan. 11, 2016, issued in Chinese Patent Application No. 201380043997.2, with English translation. (26 pages).

European Official Communication dated Sep. 18, 2017, issued in counterpart European Application No. 13830458.9 (5 pages).

Office Action dated Jan. 6, 2017, issued in counterpart Chinese Patent Application No. 201380043997.2, with English translation. (15 pages).

Office Action with Search Report dated Jul. 28, 2016, issued in counterpart Taiwanese Patent Application No. 102121520, with English translation. (10 pages).

Office Action with Search Report dated Sep. 14, 2016, issued in counterpart Chinese Patent Application No. 201380043997.2, with English translation. (20 pages).

Office Action dated May 24, 2016, issued in counterpart Japanese Patent Application No. 2012-185197, with English translation. (13 pages).

* cited by examiner

COMPOUND SOLAR CELL AND PRODUCTION METHOD THEREFOR

TECHNICAL FIELD

The present invention relates to a compound solar cell which includes a light absorbing layer formed of a Group I-III-VI compound semiconductor such as a $CuInSe_2$ (CIS) compound semiconductor composed of Group I, III and VI elements or a $Cu(In,Ga)Se_2$ (CIGS) compound semiconductor prepared in the form of solid solution by incorporating Ga into $CuInSe_2$, and has a higher photoelectric conversion efficiency (hereinafter referred to as "conversion efficiency"), and a method for efficiently producing the compound solar cell.

BACKGROUND ART

Out of various types of solar cells, compound solar cells including a light absorbing layer formed of a CIS or CIGS (hereinafter referred to as "CIGS type") compound semiconductor are known to be advantageous in that they can be produced in the form of a thin film as having a higher conversion efficiency and are less liable to suffer from reduction in conversion efficiency due to light irradiation or the like.

Conventionally, such a solar cell has a buffer layer formed by chemically depositing Zn(O,S) or the like (see PLT1). Where the buffer layer is formed by the chemical deposition method, however, the solar cell is produced by performing a light absorbing layer forming step in a vacuum, once taking out the resulting product to an atmospheric environment to perform a buffer layer forming step, and performing a front side electrode layer forming step again in a vacuum. Therefore, these steps cannot be sequentially performed, resulting in reduction in productivity. To cope with this, it has been proposed to form the buffer layer by a sputtering method rather than by the chemical deposition method so that these steps can be sequentially performed in a vacuum to increase the productivity (see PLT2). On the other hand, it is known that, where a difference $\Delta Ec$ in conduction band between the light absorption layer and the buffer layer is set to $0 \leq \Delta Ec \leq 0.4$, the recombination of carriers around the interface between the light absorbing layer and the buffer layer can be efficiently suppressed to provide a higher conversion efficiency (see NPL1). Further, where the CIGS type compound semiconductor is used for the light absorbing layer, exemplary materials for the buffer layer having a conduction band satisfying the aforementioned condition include mixed crystal compounds such as Zn(O,S,OH), In(S,OH) and (Zn,Mg)O.

RELATED ART DOCUMENT

Patent Document

PLT1: JP-A-2002-343987
PLT2: JP-A-2002-124688

Non-Patent Document

NPL1: Current Applied Physics, Volume 10, Issue 2, Supplement, March 2010, Pages S150-S153 (Minemoto et al.)

SUMMARY

The composition of the CIGS type compound semiconductor having a higher photoelectric conversion efficiency is currently such that the ratio between Ga and In is in a range of $0.2 \leq Ga/(In+Ga) \leq 0.5$. In order to control an offset between the conduction band of the Ga-rich CIGS type compound semiconductor and the conduction band of the buffer layer to $0 \leq \Delta Ec \leq 0.4$, the ratio of ZnS to ZnO, the ratio of MgO to ZnO and the ratio of InO to InS need to be increased. If the InO ratio is increased, however, crystals of the compound are liable to be oriented at random. Where the mixed crystal compound having a random crystal orientation is used for the buffer layer, the recombination of the carriers occurs around the interface between the light absorbing layer and the buffer layer, thereby disadvantageously reducing the conversion efficiency. Therefore, it is desirable to improve the compound solar cell so as to provide a higher conversion efficiency.

In view of the foregoing, it is an object of the present invention to provide a compound solar cell which can be produced by sequentially performing the process steps without the need for performing the buffer layer forming step in the atmospheric environment and yet has a higher conversion efficiency, and a production method for the compound solar cell.

According to a first aspect of the present invention to achieve the aforementioned object, there is provided a compound solar cell which includes: a compound light absorbing layer provided over a substrate and made of a Group I-III-VI compound semiconductor; a buffer layer; a front side electrode layer; and an interface layer provided between the compound light absorbing layer and the buffer layer and made of a mixed crystal compound having a composition represented by the following general formula (1):

$$Zn(O_x, S_{1-x}) \qquad (1)$$

wherein X is $0.9 < X \leq 1$ or $0 \leq X < 0.1$.

According to a second aspect of the present invention, there is provided a method for producing the compound solar cell according to the first aspect, the method including the steps of: forming a compound light absorbing layer of a Group I-III-VI compound semiconductor over an elongated substrate while transporting the substrate in a longitudinal direction; forming an interface layer; forming a buffer layer; and forming a front side electrode layer; wherein the compound light absorbing layer forming step, the interface layer forming step, the buffer layer forming step and the front side electrode layer forming step are performed sequentially in this order in a vacuum.

In the inventive compound solar cell, the interface layer made of the mixed crystal compound having the composition represented by the above general formula (1) is provided between the compound light absorbing layer and the buffer layer. The compound light absorbing layer is in contact with the interface layer made of the mixed crystal compound which has a crystal orientation generally perpendicular to a surface of the compound light absorbing layer. Therefore, lattice defects are less liable to occur in the interface between the compound light absorbing layer and the interface layer, so that the recombination of the carriers is effectively suppressed. This prevents the reduction in conversion efficiency. Further, the buffer layer is provided on the interface layer having a crystal orientation perpendicular to the surface of the compound light absorbing layer. Influenced by the crystal orientation of the interface layer, therefore, the buffer layer easily has a crystal orientation perpendicular to the surface of the compound light absorbing layer. Therefore, electrons generated in the light absorbing layer easily reach the front side electrode layer, so that the recombination is suppressed. In the inventive compound solar cell, the compound light absorbing layer is made of the Group I-III-VI compound semiconductor and, therefore, has a higher conversion efficiency even in the form of a thin film. Since the reduction in conversion efficiency is prevented, the inventive compound solar cell has excellent characteristic properties.

Where the buffer layer is made of a mixed crystal compound having a composition represented by the following general formula (2), the buffer layer is transparent to light of the visible spectral region. Therefore, the buffer layer is free from light absorption loss, so that the conversion efficiency can be further increased.

$$Zn(O_Y,S_{1-Y}) \qquad (2)$$

wherein Y is $0.5 \le Y < 1$.

Where the buffer layer is made of a mixed crystal compound having a composition represented by the following general formula (3), the buffer layer is transparent to light of the visible spectral region. Therefore, the buffer layer is free from light absorption loss, so that the conversion efficiency can be further increased.

$$(Zn_Z,Mg_{1-Z})O \qquad (3)$$

wherein Z is $0.5 \le Z < 1$.

Where the steps of forming the compound light absorbing layer of the Group I-III-VI compound semiconductor over the elongated substrate while transporting the substrate in the longitudinal direction, forming the interface layer, forming the buffer layer, and forming the front side electrode layer are performed sequentially in this order in a vacuum in the method for producing the compound solar cell according to the first aspect, there is no need to once take out the substrate over which the compound light absorbing layer is formed into the atmospheric environment to perform the buffer layer forming step after performing the compound light absorbing layer forming step in a vacuum, and then perform the front side electrode layer forming step again in the vacuum. Therefore, the compound solar cell can be efficiently produced at lower costs as having excellent characteristic properties.

DESCRIPTION OF EMBODIMENTS

Next, embodiments of the present invention will be described.

Figure 1:
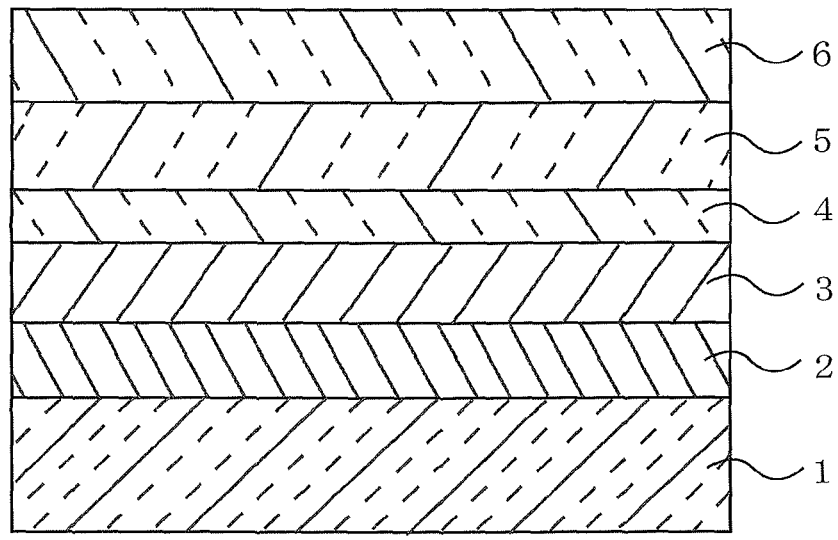
FIG. 1 is a sectional view of a CIGS solar cell according to an embodiment of the present invention.

FIG. 1 is a sectional view of a CIGS solar cell according to an embodiment of the present invention. The CIGS solar cell includes a substrate 1, a back side electrode layer 2, a CIGS light absorbing layer (compound light absorbing layer) 3, a buffer layer 5 and a front side electrode layer 6 provided in this order, and an interface layer 4 made of a mixed crystal compound having a composition represented by the following general formula (1) is provided between the CIGS light absorbing layer 3 and the buffer layer 5. These layers will hereinafter be described in detail. In FIG. 1, these layers are schematically illustrated as each having a thickness, a size and an appearance different from actual ones (this definition is effective in other drawings).

$$Zn(O_x,S_{1-x}) \qquad (1)$$

wherein X is $0.9 < X \le 1$ or $0 \le X < 0.1$.

The substrate 1 serves as a support base, and is properly selected from a glass substrate, a metal substrate and a resin substrate according to the purpose and the design requirements for use. Preferred examples of the glass substrate include a lower alkali glass substrate containing an alkali metal element in a very small amount (higher-strain-point glass substrate), an alkali-free glass substrate containing no alkali metal element, and a blue sheet glass substrate. It is particularly preferred to use the blue sheet glass substrate as the substrate 1, because the alkali metal element is diffused from the substrate 1 into the CIGS light absorbing layer 3 to improve the characteristic properties of the solar cell. Where a substrate containing no alkali metal element or a substrate containing the alkali metal element in a smaller amount is used, the alkali metal element is preferably added to the CIGS light absorbing layer before, after or during the formation of the CIGS light absorbing layer.

The substrate 1 preferably has an elongated shape and is preferably flexible. In this case, the CIGS solar cell can be produced by a roll-to-roll method or a stepping roll method. The term "elongated" herein means that the length is not less than ten times the width, preferably not less than 30 times the width.

The substrate 1 preferably has a thickness of 5 to 200 μm, more preferably 10 to 100 μm. If the thickness is excessively great, the CIGS solar cell is liable to lose its flexibility. Therefore, when the CIGS solar cell is bent, a greater stress is liable to be applied to the CIGS solar cell, thereby damaging the layered structure including the CIGS light absorbing layer 3 and the like. If the thickness is excessively small, on the other hand, the substrate 1 is liable to be buckled in the production of the CIGS solar cell, thereby increasing the percentage of defective products.

The back side electrode layer 2 to be provided over the substrate 1 has a single layer structure or a multi-layer structure formed from molybdenum (Mo), tungsten (W), chromium (Cr) and/or titanium (Ti).

The back side electrode layer 2 preferably has a thickness (a total thickness of the plural layers of the multi-layer structure) of 10 to 1000 μm. Where the substrate 1 is electrically conductive to double as the back side electrode layer 2, however, there is no need to provide the back side electrode layer 2.

If an impurity is thermally diffused from the substrate 1, the impurity adversely influences the performance of the CIGS solar cell. In order to prevent the thermal diffusion, a barrier layer (not shown) may be provided on the substrate 1 or on the back side electrode layer 2. The barrier layer may be formed from a material such as Cr, nickel (Ni), NiCr and/or cobalt (Co) by a sputtering method, an evaporation method, a CVD method, a sol-gel method, a liquid phase deposition method or the like.

The CIGS light absorbing layer 3 to be provided over the back side electrode layer 2 is formed of a compound semiconductor having a chalcopyrite crystal structure containing four elements including copper (Cu), indium (In), gallium (Ga) and selenium (Se). The CIGS light absorbing layer 3 preferably has a thickness of 1.0 to 3.0 μm, more preferably 1.5 to 2.5 μm. If the thickness is excessively small, the light absorbing layer is liable to have a smaller light absorption amount, thereby deteriorating the performance of the solar cell. If the thickness is excessively great, on the other hand, the time required for the formation of the CIGS light absorbing layer 3 is liable to be increased, thereby reducing the productivity. The CIGS light absorbing layer 3 may be formed by a vacuum evaporation method, a selenization/sulfidation method, a sputtering method or the like.

The Cu—In—Ga composition ratio of the CIGS light absorbing layer 3 preferably satisfies an expression of 0.7<Cu/(Ga+In)<0.95 (molar ratio). If the expression is satisfied, $Cu_{(2-X)}Se$ is prevented from being excessively incorporated into the CIGS light absorbing layer 3, thereby keeping the entire layer in a slightly Cu-poor state. The ratio between Ga and In which are homologous elements is preferably in a range of 0.10<Ga/(Ga+In)<0.40 (molar ratio).

The interface layer 4 to be provided on the CIGS light absorbing layer 3 (between the CIGS light absorbing layer 3 and the buffer layer 5) is formed of a solitary crystal compound or a mixed crystal compound having a composition represented by the following general formula (1). Since the interface layer having a higher ratio of ZnO or ZnS is thus provided in contact with the CIGS light absorbing layer 3, crystals present around the interface can be orientated in a predetermined direction. This advantageously suppresses recombination of carriers around the interface.

$$Zn(O_x, S_{1-x}) \quad (1)$$

wherein X is 0.9<X≤1 or 0≤X<0.1

More specifically, the interface layer 4 (ZnOS film) is formed of the solitary crystal compound or the mixed crystal compound, but ZnO and ZnS have different crystal structures with different ion radiuses and different lattice constants. Where X is 0.9<X≤1 in the above general formula (1), the interface layer 4 has a ZnO-based wurtzite type crystal structure with a higher ZnO composition ratio. Therefore, differences in ion radius and lattice constant between ZnO and ZnS do not significantly influence the crystal state. Where X is 0≤X<0.1 in the above general formula (1), the interface layer 4 has a ZnS-based sphalerite type crystal structure with a higher ZnS composition ratio. Therefore, differences in ion radius and lattice constant are small. However, it was found that, where X is 0.1<X≤0.9 in the above general formula (1), the interface layer 4 has (101) orientation and (100) orientation in addition to (002) orientation and, therefore, the crystal orientation is disturbed. If crystals are oriented at random in the interface layer 4, electrons generated in the CIGS light absorbing layer 3 cannot smoothly reach the front side electrode layer 6. This reduces the performance of the solar cell.

The buffer layer 5 to be provided on the interface layer 4 is formed of a mixed crystal compound containing a Group II or III element. The compound for the buffer layer 5 is preferably a higher resistance n-type semiconductor so that the buffer layer 5 can be combined with the CIGS light absorbing layer 3 through pn-junction. The buffer layer 5 may have a single layer structure or a multi-layer structure including a plurality of sublayers. Besides Mg—ZnO mixed crystal compounds, exemplary materials for the buffer layer 5 include CdS, ZnMgO, ZnCaO, ZnMgCaO, ZnMgSrO, ZnSrO, ZnO, ZnS, Zn(OH)$_2$, In$_2$O$_3$ and In$_2$S$_3$, and mixed crystal compounds of any of these compounds such as Zn(O,S,OH) and Zn(O,S). Particularly, where Zn(O$_Y$,S$_{1-Y}$) (wherein Y is 0.5≤Y<1) or (Zn$_Z$,Mg$_{1-Z}$)O (wherein Z is 0.5≤Z<1) is used, reduction in conversion efficiency due to conduction band discontinuity can be suppressed. In addition, the buffer layer 5 is transparent to light of the visible spectral range, so that the light absorption loss can be substantially prevented. The buffer layer 5 preferably has a thickness of 50 to 200 nm.

The front side electrode layer 6 to be provided on the buffer layer 5 is an electrically conductive transparent layer. A material which has a higher transmittance and a lower resistance and can be formed into a thin film is preferably used for the electrically conductive transparent layer, and examples of the material include GZO, ITO, IZO and aluminum zinc oxide (Al:ZnO). The transparent electrode layer 6 preferably has a thickness of 50 to 300 nm. The transparent electrode layer 6 preferably has a light transmittance of higher than 80%.

In the CIGS solar cell having the aforementioned construction, as described above, the interface layer 4 having a specific composition is provided between the CIGS light absorbing layer 3 and the buffer layer 5, so that the lattice defects are less liable to occur in the interface between the CIGS light absorbing layer 3 and the interface layer 4 and the recombination of the carriers are effectively suppressed. Therefore, the CIGS solar cell can sufficiently exhibit excellent performance with a higher conversion efficiency. Further, the CIGS light absorbing layer 3 has a chalcopyrite structure and, even in the form of a thin film, has a higher conversion efficiency. Thus, the solar cell can be produced in the thin film form, so that the solar cell can transmit light of non-usable wavelengths at a higher possibility. Therefore, the solar cell has a wider range of use applications and usable areas.

The CIGS solar cell can be produced, for example, in the following manner. First, an elongated substrate 1 is prepared, and a back side electrode layer 2, a CIGS light absorbing layer 3, an interface layer 4, a buffer layer 5 and a front side electrode layer 6 are formed sequentially in this order over a surface of the substrate 1 by a roll-to-roll method. The respective layer forming steps of the production method will hereinafter be described in detail.

[Step of Forming Back Side Electrode Layer 2]

While the elongated substrate 1 is transported by the roll-to-roll method, the back side electrode layer 2 is formed from Mo or other material over the surface of the elongated substrate 1, for example, by a sputtering method, an evaporation method, an inkjet method or the like.

[Step of Forming CIGS Light Absorbing Layer 3]

While the substrate 1 formed with the back side electrode layer 2 is transported by the roll-to-roll method, the CIGS light absorbing layer 3 is formed over the back side electrode layer 2. Exemplary methods for the formation of the CIGS light absorbing layer 3 include a vacuum evaporation method, a selenization/sulfidation method and a sputtering method.

[Step of Forming Interface Layer 4]

While the substrate 1 formed with the CIGS light absorbing layer 3 and the like is transported by the roll-to-roll method, the interface layer 4 is formed on the CIGS light absorbing layer 3. Exemplary methods for the formation of the interface layer 4 include a sputtering method and an evaporation method. Particularly, the sputtering method is preferred because the composition can be easily controlled as desired. The sputtering method may be a target sputtering method which employs a cathode target having a desired composition, a reactive sputtering method in which a chalcogen molecule or compound such as oxygen or hydrogen sulfide is supplied during the sputtering of a Zn material, or another method. A common magnetron sputtering apparatus or an opposed target sputtering apparatus including two cathode targets disposed in opposed relation may be used for the sputtering method. Where the opposed target sputtering apparatus is used, plasma can be confined between the opposed cathode targets and, therefore, the substrate 1 is not exposed to the plasma. Thus, the substrate 1 is less liable to be damaged by charged particles (electrons and ions) and recoiled argon, and defects and voids are less liable to occur in a film formation surface and an underlying surface. Therefore, the opposed target sputtering apparatus is advantageous. Power is applied to the pair of targets by using a radio frequency (RF) power source or by using the radio frequency (RF) power source and a direct current (DC) power source in superposition.

Figure 2:
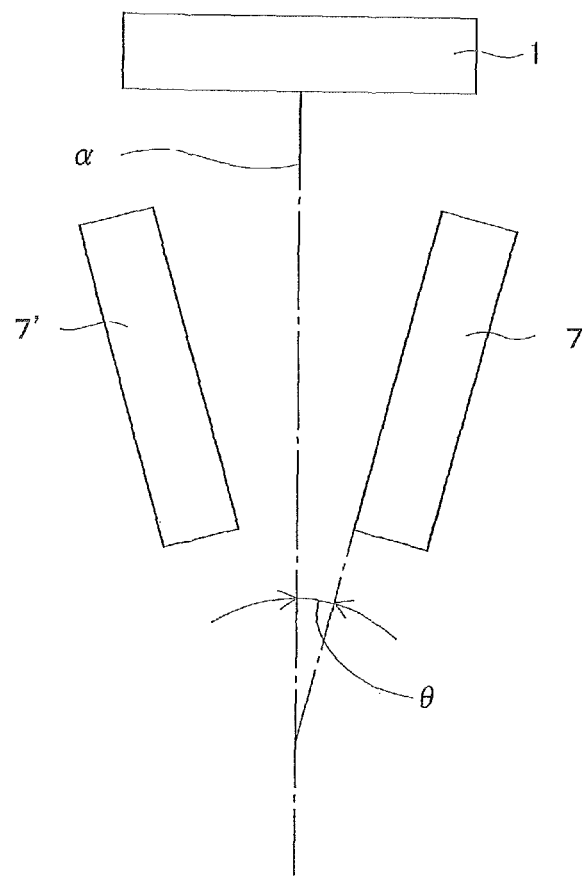
FIG. 2 is a diagram for explaining an exemplary positional relationship between cathode targets and a substrate in a sputtering apparatus to be employed for production of the CIGS solar cell.

Particularly, the two cathode targets 7, 7' are preferably disposed in opposed relation on opposite sides of a phantom center axis α extending perpendicularly to a layer formation surface of the substrate 1, so as to be arranged in a generally V-shape open toward the layer formation surface of the substrate 1 (toward the substrate 1) as shown in FIG. 2 in the opposed target sputtering apparatus. In this case, the film formation can be achieved with a reduced power, so that the film formation surface and the underlying surface are less liable to be damaged. Particularly, at least one 7 (7') of the cathode targets 7, 7' preferably forms an angle θ of 5 to 15 degrees with respect to the phantom center axis α. In FIG. 2, the back side electrode layer 2 and the CIGS light absorbing layer 3 formed over the substrate 1 are not shown.

[Step of Forming Buffer Layer 5]

While the substrate 1 formed with the interface layer 4 and the like is transported by the roll-to-roll method, the buffer layer 5 is formed on the interface layer 4. Exemplary methods for the formation of the buffer layer 5 include a solution growth method, a vacuum evaporation method, a CVD method, an ALD method and a sputtering method. Particularly, the sputtering method is preferably used because the composition can be easily controlled as desired. As in the formation of the interface layer 4, the opposed target sputtering apparatus including the cathode targets 7, 7' disposed in the specific arrangement as shown in FIG. 2 is preferably used. With the use of this apparatus, the film formation can be achieved with a reduced power, and the film formation surface and the underlying surface are less liable to be damaged.

[Step of Forming Front Side Electrode Layer 6]

While the substrate 1 formed with the buffer layer 5 and the like is transported by the roll-to-roll method, the front side electrode layer 6 is formed on the buffer layer 5. Exemplary methods for the formation of the front side electrode layer 6 include a sputtering method, an evaporation method and an organic metal vapor-phase growth method (MOCVD method) Particularly, the sputtering method is preferably used because the composition can be easily controlled as desired. As in the formation of the interface layer 4 and the buffer layer 5, the opposed target sputtering apparatus including the cathode targets 7, 7' disposed in the specific arrangement as shown in FIG. 2 is preferably used for the same reason.

In this manner, the inventive CIGS solar cell is produced. In this method, the steps of forming the respective layers can be sequentially performed in a vacuum without the need for the prior-art complicated process steps of once taking out the substrate 1 to the atmospheric environment for the formation of the buffer layer 5 after the formation of the CIGS light absorbing layer 3 and then forming the front side electrode layer 6 again in a vacuum. In addition, the inventive CIGS solar cell can be produced as having a higher conversion efficiency even by sequentially performing the process steps. Therefore, it is possible to reduce the production time while ensuring a higher performance.

Where the substrate 1 also functions as the back side electrode layer 2 (the substrate 1 is electrically conductive) in the above production method, the step of forming the back side electrode layer 2 can be obviated, and the substrate 1 can be used on an as-is basis as the back side electrode layer.

Figure 3:
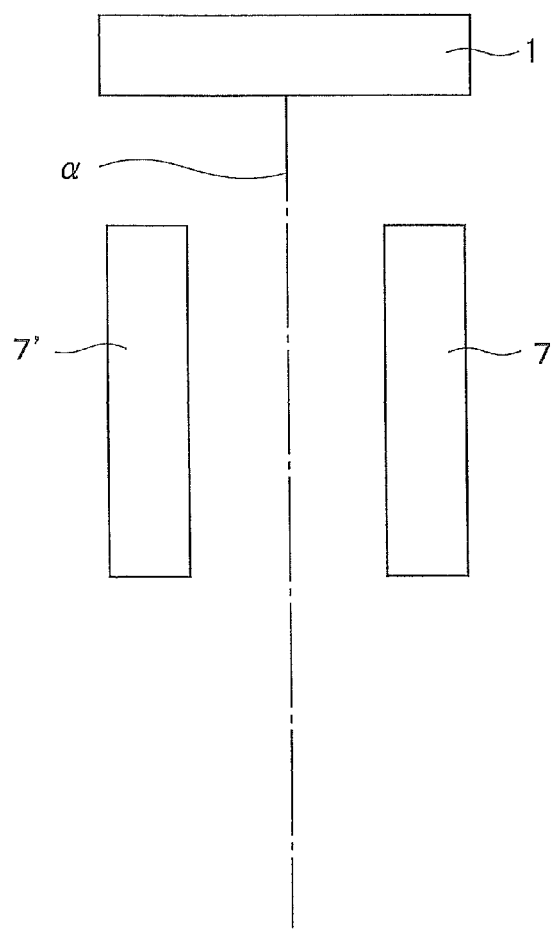
FIG. 3 is a diagram for explaining another exemplary positional relationship between the cathode targets and the substrate in the sputtering apparatus.
Figure 4:
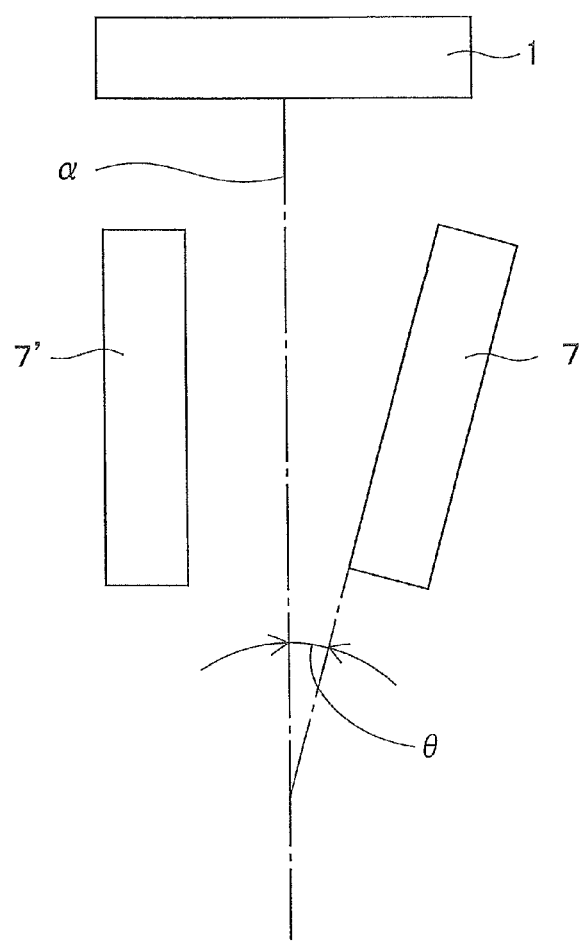
FIG. 4 is a diagram for explaining further another exemplary positional relationship between the cathode targets and the substrate in the sputtering apparatus.

In the opposed target sputtering apparatus to be advantageously used in the steps of forming the interface layer 4, the buffer layer 5 and the front side electrode layer 6 in the above production method, the cathode targets 7, 7' are not necessarily required to be disposed in the generally V-shaped arrangement open toward the substrate 1, but may be disposed parallel to each other as shown in FIG. 3 depending on the composition of the cathode targets 7, 7' and the sputtering conditions. Further, as shown in FIG. 4, one of the cathode targets (in this example, the cathode target 7) may be inclined at an angle θ with respect to the phantom center axis α.

In the above production method, the back side electrode layer 2, the CIGS light absorbing layer 3, the interface layer 4, the buffer layer 5 and the front side electrode layer 6 are formed by the roll-to-roll method. However, these layers are not necessarily required to be formed by the roll-to-roll method, but may be sequentially formed one on another on each of individually prepared substrates 1. Where these layers are sequentially formed by the roll-to-roll method, however, the production efficiency can be improved. Where the CIGS light absorbing layer 3, the interface layer 4, the buffer layer 5 and the front side electrode layer 6 are sequentially formed in this order over the elongated substrate transported in the longitudinal direction in a vacuum, the CIGS solar cell can be produced as having excellent characteristic properties at lower costs. Therefore, this method is particularly advantageous.

EXAMPLES

Next, inventive examples will be described in conjunction with comparative examples. However, it should be understood that the present invention be not limited to the following examples.

Example 1

(Formation of Back Side Electrode Layer)

On a degreased surface of a soda-lime glass substrate (having a thickness of 0.55 mm, a width of 20 mm and a length of 20 mm, and having a square shape as seen in plan), a back side electrode layer of Mo having a thickness of 0.8 μm was formed at a sputtering rate of 60 nm/min at a sputtering pressure of 1 Pa in an argon discharge gas with the use of a direct current (DC) power source by means of a magnetron sputtering apparatus (SH-450 available from Ulvac Inc.)

(Formation of CIGS Light Absorbing Layer)

Next, a CIGS light absorbing layer was formed on the back side electrode layer formed in the aforementioned manner. That is, Ga, In, Cu, Se evaporation sources were placed in a chamber of the vacuum vapor deposition apparatus, and In, Ga and Se were simultaneously evaporated for 32 minutes with the chamber kept at a vacuum degree of $1 \times 10^{-4}$ Pa and with the substrate temperature kept at 250° C. Thereafter, Cu and Se were simultaneously evaporated for 33 minutes, while the substrate temperature was increased up to 550° C. at a temperature increase rate of 20° C./min. With the substrate temperature finally kept at 550° C., In, Ga and Se were simultaneously evaporated. Thus, the CIGS light absorbing layer was formed on the back side electrode layer. The Ga evaporation source, the In evaporation source, the Cu evaporation source and the Se evaporation source were heated to 950° C., 780° C., 1100° C. and 140° C., respectively. The resulting CIGS light absorbing layer had a composition such that Cu/Group III=0.89 and Ga/Group III=0.31 (atomic %) and had a thickness of 2.1 μm.

(Formation of Interface Layer)

By means of an opposed target sputtering apparatus including a pair of cathode targets disposed in a generally V-shaped arrangement (at an angle θ of 10 degrees with respect to a phantom center axis α) as shown in FIG. 2, an interface layer was formed on the CIGS light absorbing layer formed in the aforementioned manner. The cathode targets each had a composition of ZnO, and Ar was used as a discharge gas for the sputtering. The interface layer was formed as having a thickness of 0.5 nm at a sputtering pressure of 0.3 Pa by controlling the formation period with a power of 100 W applied by a radio frequency (RF) power source.

(Formation of Buffer Layer)

By means of an opposed target sputtering apparatus including a pair of cathode targets disposed in a generally V-shaped arrangement (at an angle θ of 10 degrees with respect to a phantom center axis α) as shown in FIG. 2, a buffer layer was formed on the interface layer in substantially the same manner as the interface layer. The cathode targets each had a composition of $Zn_{0.85}Mg_{0.15}O$, and Ar was used as a discharge gas for the sputtering. The buffer layer was formed as having a thickness of 70 nm at a power density of 0.7 kW/cm$^2$ at a sputtering pressure of 0.3 Pa with the use of a radio frequency (RF) power source by controlling the power and the formation period.

(Formation of Front Side Electrode Layer)

By means of a magnetron sputtering apparatus (SH-450 available from Ulvac Inc.), a front side electrode layer was formed on the buffer layer formed in the aforementioned manner. ITO (containing 90 atomic % of $In_2O_3$ and 10 atomic % of $SnO_2$) was used as the cathode targets, and a gas mixture containing Ar and $O_2$ (one tenth the Ar flow rate) was used as a discharge gas. The front side electrode layer was formed of ITO as having a thickness of 200 nm at a sputtering rate of 20 nm/min at a sputtering pressure of 0.3 Pa with the use of a radio frequency (RF) power source.

Examples 2 to 27

CIGS solar cells were produced in substantially the same manner as in Example 1, except that conditions for the production were changed as shown below in Tables 1 to 3.

Comparative Examples 1 and 2

CIGS solar cells were produced in substantially the same manner as in Example 1, except that the interface layer was not formed and conditions for the production were changed as shown below in Table 4.

Comparative Examples 3 to 14

CIGS solar cells were produced in substantially the same manner as in Example 1, except that conditions for the production were changed as shown below in Table 4.

The conversion efficiencies of the CIGS solar cells thus produced in Examples and Comparative Examples were measured in the following manner, and the results are shown below in Tables 1 to 4.

<Conversion Efficiency>

For each of Examples and Comparative Examples, 20 CIGS solar cells were prepared, and irradiated with artificial sun light (Air Mass=1.5). The conversion efficiencies of the respective CIGS solar cells were measured by means of an IV measurement system (available from Yamashita Denso Corporation).

TABLE 1

| Example | Interface layer Composition | Thickness (nm) | Composition of buffer layer | Conversion efficiency (%) |
|---|---|---|---|---|
| 1 | ZnO | 0.5 | $(Zn_{0.8}, Mg_{0.2})O$ | 9.0 |
| 2 | ZnO | 0.5 | $Zn(O_{0.8}, S_{0.2})$ | 9.7 |
| 3 | ZnO | 2 | $(Zn_{0.8}, Mg_{0.2})O$ | 10.9 |
| 4 | ZnO | 2 | $Zn(O_{0.8}, S_{0.2})$ | 10.4 |
| 5 | ZnO | 5 | $(Zn_{0.8}, Mg_{0.2})O$ | 10.9 |
| 6 | ZnO | 10 | $(Zn_{0.8}, Mg_{0.2})O$ | 10.5 |
| 7 | ZnO | 10 | $Zn(O_{0.8}, S_{0.2})$ | 10.4 |
| 8 | ZnS | 0.5 | $(Zn_{0.8}, Mg_{0.2})O$ | 9.5 |
| 9 | ZnS | 0.5 | $Zn(O_{0.8}, S_{0.2})$ | 9.5 |
| 10 | ZnS | 2 | $(Zn_{0.8}, Mg_{0.2})O$ | 10.5 |

TABLE 2

| Example | Interface layer Composition | Thickness (nm) | Composition of buffer layer | Conversion efficiency (%) |
|---|---|---|---|---|
| 11 | ZnS | 2 | $Zn(O_{0.8}, S_{0.2})$ | 10.1 |
| 12 | ZnS | 5 | $(Zn_{0.8}, Mg_{0.2})O$ | 10.2 |
| 13 | ZnS | 10 | $(Zn_{0.8}, Mg_{0.2})O$ | 10.7 |
| 14 | ZnS | 10 | $Zn(O_{0.8}, S_{0.2})$ | 10.1 |
| 15 | $Zn(O_{0.92}, S_{0.08})$ | 0.5 | $(Zn_{0.8}, Mg_{0.2})O$ | 9.4 |
| 16 | $Zn(O_{0.92}, S_{0.08})$ | 0.5 | $Zn(O_{0.8}, S_{0.2})$ | 9.7 |
| 17 | $Zn(O_{0.92}, S_{0.08})$ | 2 | $(Zn_{0.8}, Mg_{0.2})O$ | 11.0 |
| 18 | $Zn(O_{0.92}, S_{0.08})$ | 2 | $Zn(O_{0.8}, S_{0.2})$ | 10.5 |
| 19 | $Zn(O_{0.92}, S_{0.08})$ | 5 | $Zn(O_{0.8}, S_{0.2})$ | 10.8 |

TABLE 3

| Example | Interface layer Composition | Thickness (nm) | Composition of buffer layer | Conversion efficiency (%) |
|---|---|---|---|---|
| 20 | $Zn(O_{0.92}, S_{0.08})$ | 10 | $Zn(O_{0.8}, S_{0.2})$ | 10.3 |
| 21 | $Zn(S_{0.92}, O_{0.08})$ | 0.5 | $(Zn_{0.8}, Mg_{0.2})O$ | 9.8 |
| 22 | $Zn(S_{0.92}, O_{0.08})$ | 0.5 | $Zn(O_{0.8}, S_{0.2})$ | 9.4 |
| 23 | $Zn(S_{0.92}, O_{0.08})$ | 2 | $(Zn_{0.8}, Mg_{0.2})O$ | 10.9 |
| 24 | $Zn(S_{0.92}, O_{0.08})$ | 2 | $Zn(O_{0.8}, S_{0.2})$ | 10.3 |
| 25 | $Zn(S_{0.92}, O_{0.08})$ | 5 | $(Zn_{0.8}, Mg_{0.2})O$ | 10.0 |
| 26 | $Zn(S_{0.92}, O_{0.08})$ | 10 | $(Zn_{0.8}, Mg_{0.2})O$ | 10.0 |
| 27 | $Zn(S_{0.92}, O_{0.08})$ | 10 | $Zn(O_{0.8}, S_{0.2})$ | 10.3 |

TABLE 4

| Comparative Example | Interface layer Composition | Thickness (nm) | Composition of buffer layer | Conversion efficiency (%) |
|---|---|---|---|---|
| 1 | None | | $(Zn_{0.8}, Mg_{0.2})O$ | 7.1 |
| 2 | None | | $Zn(O_{0.8}, S_{0.2})$ | 8.2 |

TABLE 4-continued

| Comparative Example | Interface layer Composition | Thickness (nm) | Composition of buffer layer | Conversion efficiency (%) |
|---|---|---|---|---|
| 3 | $Zn(O_{0.85}, S_{0.15})$ | 0.5 | $(Zn_{0.8}, Mg_{0.2})O$ | 7.0 |
| 4 | $Zn(O_{0.85}, S_{0.15})$ | 0.5 | $Zn(O_{0.8}, S_{0.2})$ | 8.3 |
| 5 | $Zn(O_{0.85}, S_{0.15})$ | 2 | $(Zn_{0.8}, Mg_{0.2})O$ | 7.9 |
| 6 | $Zn(O_{0.85}, S_{0.15})$ | 2 | $Zn(O_{0.8}, S_{0.2})$ | 8.4 |
| 7 | $Zn(O_{0.85}, S_{0.15})$ | 5 | $(Zn_{0.8}, Mg_{0.2})O$ | 8.3 |
| 8 | $Zn(O_{0.85}, S_{0.15})$ | 10 | $(Zn_{0.8}, Mg_{0.2})O$ | 8.4 |
| 9 | $Zn(S_{0.85}, O_{0.15})$ | 0.5 | $(Zn_{0.8}, Mg_{0.2})O$ | 7.6 |
| 10 | $Zn(S_{0.85}, O_{0.15})$ | 0.5 | $Zn(O_{0.8}, S_{0.2})$ | 8.4 |
| 11 | $Zn(S_{0.85}, O_{0.15})$ | 2 | $(Zn_{0.8}, Mg_{0.2})O$ | 8.1 |
| 12 | $Zn(S_{0.85}, O_{0.15})$ | 2 | $Zn(O_{0.8}, S_{0.2})$ | 8.2 |
| 13 | $Zn(S_{0.85}, O_{0.15})$ | 5 | $(Zn_{0.8}, Mg_{0.2})O$ | 8.5 |
| 14 | $Zn(S_{0.85}, O_{0.15})$ | 10 | $(Zn_{0.8}, Mg_{0.2})O$ | 7.7 |

The above results indicate that the CIGS solar cells of Examples 1 to 27 each had an excellent conversion efficiency on the order of 9.0% or higher. On the other hand, the CIGS solar cells of Comparative Examples 1 and 2 provided with no interface layer each had a lower conversion efficiency. This is supposedly because the re-absorption of carriers occurred in the interface between the CIGS light absorbing layer and the buffer layer. Even with the provision of the interface layers, the CIGS solar cells of Comparative Examples 3 to 14 in which the interface layers each had a composition not satisfying the above general formula (1) each had a conversion efficiency of 8.5% or lower. Thus, the conversion efficiency was lower as in Comparative Examples 1 and 2 provided with no interface layer.

While specific forms of the embodiment of the present invention have been shown in the aforementioned inventive examples, the inventive examples are merely illustrative of the invention but not limitative of the invention. It is contemplated that various modifications apparent to those skilled in the art could be made within the scope of the invention.

The inventive compound solar cell has a higher conversion efficiency even in the form of a thin film and, therefore, is applicable to a variety of applications. The inventive method for producing the compound solar cell makes it possible to sequentially perform the respective layer forming steps without the need for once taking out the substrate to the atmospheric environment for the formation of the buffer layer. Therefore, the inventive method is suitable for producing the solar cell at lower costs at a higher efficiency.

REFERENCE SIGNS LIST

1 SUBSTRATE
3 CIGS LIGHT ABSORBING LAYER
4 INTERFACE LAYER
5 BUFFER LAYER
6 FRONT SIDE ELECTRODE LAYER

The invention claimed is:

1. A compound solar cell, comprising:
a compound light absorbing layer provided over a substrate and made of a Group compound semiconductor;
a buffer layer;
a front side electrode layer; and
an interface layer provided between the compound light absorbing layer and the buffer layer and made of a mixed crystal compound having a composition represented by the following general formula (1):

$$Zn(O_x, S_{1-x}) \quad (1)$$

wherein X is $0.9 < X \leq 1$ or $1 \leq X < 0.1$,
wherein the buffer layer is made of a mixed crystal compound having a composition represented by the following general formula (2):

$$Zn(O_Y, S_{1-Y}) \quad (2)$$

wherein Y is $0.5 \leq Y < 0.98$, and
wherein the buffer layer has a thickness of 50 to 200 nm.

2. The compound solar cell according to claim 1, wherein the compound light absorbing layer is provided directly on a substrate.

3. The compound solar cell according to claim 1, wherein a back side electrode layer is provided between the substrate and the compound light absorbing layer.

4. The compound solar cell according to claim 1, wherein a barrier layer and a back side electrode layer are provided in this order between the substrate and the compound light absorbing layer.

5. The compound solar cell according to claim 1, wherein a back side electrode layer and a barrier layer are provided in this order between the substrate and the compound light absorbing layer.

6. A method for producing the compound solar cell comprising:
forming a compound light absorbing layer of a Group compound semiconductor over an elongated substrate while transporting the substrate in a longitudinal direction;
forming an interface layer made of a mixed crystal compound having a composition represented by the following general formula (1) with a sputtering method:

$$Zn(O_x, S_{1-x}) \quad (1)$$

wherein X is $0.9 < X \leq 1$ or $10 \leq X < 0.1$;
forming a buffer layer made of a mixed crystal compound having a composition represented by the following general formula (2) with a sputtering method:

$$Zn(O_Y, S_{1-Y}) \quad (2)$$

wherein Y is $0.5 \leq Y < 0.98$; and
forming a front side electrode layer;
wherein all of the compound light absorbing layer forming step, the interface layer forming step, the buffer layer forming step and the front side electrode layer forming step are performed sequentially in this order in a vacuum, and
wherein the buffer layer has a thickness of 50 to 200 nm.

7. The compound solar cell according to claim 1, wherein Y is $0.5 \leq Y \leq 0.8$.

8. A method for producing the compound solar cell according to claim 6, wherein Y is $0.5 \leq Y \leq 0.8$.

* * * * *